March 3, 1959 R. G. HARTFIELD 2,876,345

REMOTE OSCILLATOR TRUNK RECEIVER

Filed Jan. 7, 1958 2 Sheets-Sheet 1

INVENTOR.
Robert G. Hartfield

BY

Mueller & Aichele

Attys.

INVENTOR.
Robert G. Hartfield
BY
Mueller & Aichele
Attys.

United States Patent Office 2,876,345

Patented Mar. 3, 1959

2,876,345

REMOTE OSCILLATOR TRUNK RECEIVER

Robert G. Hartfield, Berwyn, Ill., assignor to Motorola, Inc., Chicago, Ill., a corporation of Illinois Application January 7, 1958, Serial No. 707,512

7 Claims. (Cl. 250—20)

This invention relates generally to tuning systems for radio receivers, and more particularly to an improved trunk-mounted automobile radio receiver having a directly tuned oscillator located in a dashboard-mounted control unit.

It is sometimes desirable to mount an automobile radio receiver in the trunk of the automobile and to provide a separate control unit which may be mounted near the driver—usually on the automobile dashboard. It has been proposed to provide such a receiver with a saturable reactor tuning system which is controlled remotely by a simple direct current circuit coupled to the battery-generator voltage source of the automobile. However, the voltage supplied by the battery generator varies somewhat, and it has been difficult to maintain the tuning of the oscillator of the receiver on a particular frequency without undesirable drift. Furthermore, the magnetic properties of the cores used in saturable reactor tuning systems may vary somewhat due to hysteresis causing mistracking of the oscillator.

An object of this invention is to provide an automobile radio receiver having a new and improved remote tuning system.

Another object of the invention is to provide an improved trunk-mounted automobile radio receiver in which the frequency of an oscillator which supplies a signal to the mixer stage thereof is directly controlled at a point remote from the remainder of the receiver.

Still another object of the invention is to provide a simple and reliable remote control unit for radio receivers which provides manual tuning, volume, and tone control with a minimum number of leads connecting the control unit to the receiver.

A feature of the invention is the provision of a radio receiver and a remote control unit therefor with a mechanically tuned oscillator being provided in the remote control unit to facilitate accurate tuning thereof without mistracking.

Another feature of the invention is the provision of a remote control unit for a radio receiver, including an oscillator supplying signals through a shielded lead to a mixer stage in the receiver, and further including an amplifier for increasing the level of the oscillator signals and for isolating the oscillator from the variable load presented by the shielded lead.

A further feature of the invention is the provision of a radio receiver having a plurality of tunable circuits with a first circuit being mounted in a remote control unit to permit accurate manual tuning thereof and with the other tunable circuits being mounted in the radio receiver housing and being controlled by saturable reactors which track with the first circuit.

A still further feature of the invention is the provision of an improved remote control unit for a trunk-mounted automobile radio receiver in which the control unit includes an oscillator with a mechanical device for manually tuning the same, a potentiometer ganged to the tuning device and controlling saturable reactors for tuning broadly tuned circuits in the receiver, and a simple circuit for controlling the tone and volume of the receiver output, thereby providing a complete remote control unit which is connected to the receiver by a minimum number of leads requiring shielding.

The invention is illustrated in the accompanying drawings in which.

In practicing the invention there is provided a radio receiver adapted to be mounted in the trunk of an automobile connected to a remote control unit for mounting on the dashboard thereof. The receiver has an antenna circuit and a radio frequency amplifier stage tuned by saturable reactors. A magnetizing winding of the reactors is supplied with direct current from the automobile electrical sysem which is controlled by a potentiometer mounted in the control unit. The oscillator is provided in the control unit and is directly mechanically tuned as by a movable core permeability tuner. The potentiometer controlling the saturable reactors is ganged to the mechanical drive for the oscillator, so that the antenna circuit and the radio frequency amplifier stage track with the oscillator. The lead connecting the oscillator to the receiver is shielded to prevent noise signals from being superimposed on the oscillator signals. An amplifier may be interposed between the oscillator and the shielded lead to increase the level of the oscillator signals applied to the receiver, and also to isolate the oscillator from the variable load presented by the shielded lead. The control unit may also include a simple volume-tone control circuit which is connected to the receiver by a single lead. Thus, it is apparent that the complete control unit provides manual tuning, tone, and volume control with a minimum number of leads connecting the unit to the receiver.

Figure 1:
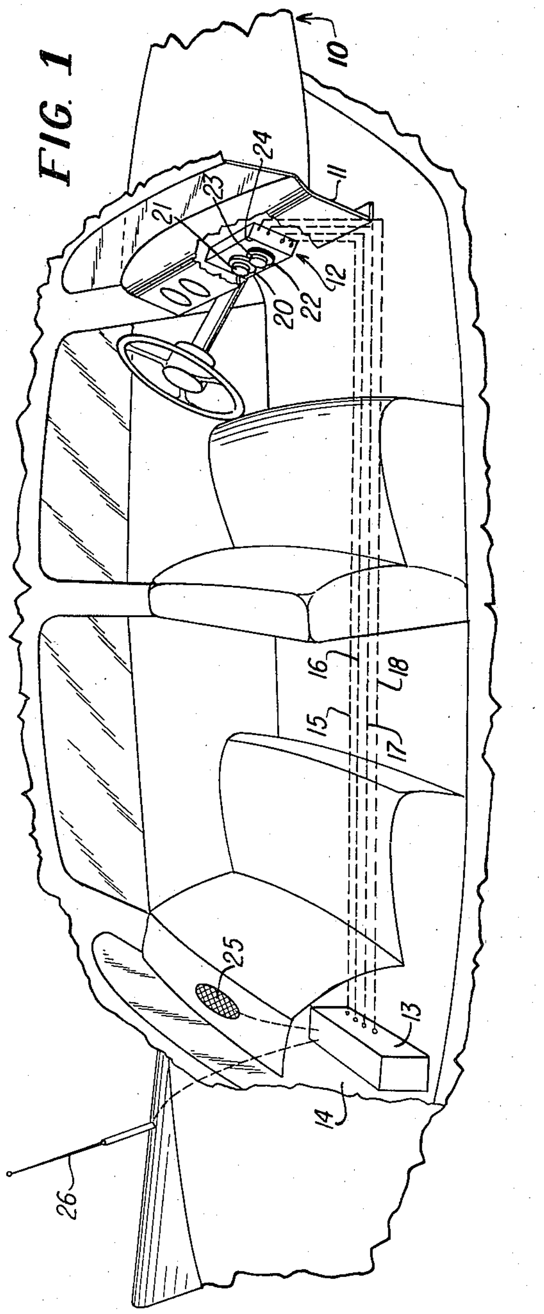
Fig. 1 is a perspective view showing a radio receiver mounted mounted in the trunk of an automobile and having a remote control unit in accordance with the invention.

Referring now to the drawings, in Fig. 1 there is shown an automobile 10 having a dashboard 11 on which a control unit 12 of a radio receiver 13 is mounted. The radio receiver 13 is mounted in the trunk 14 of the automobile, and is connected by leads 15, 16, 17 and 18 to the control unit 12. The lead 15 conducts oscillator signals which are used to provide heterodyning action in the receiver, and the lead 16 conducts audio signals and acts to control both the tone and the volume of the radio receiver. The leads 15 and 16 include a shield 61 connected to ground to prevent noise signals from being imposed on the signals conducted thereby. The lead 17 conducts direct current to a saturable reactor provided in the receiver, and the lead 18 is the power supply lead for the receiver. An on-off control 20, a tuning control 21, a tone control 22, and a volume control 23 are located on a control panel 24. A speaker 25 is located in the back seat area of the automobile, and an antenna 26 is installed near the trunk of the automobile.

Figure 2:
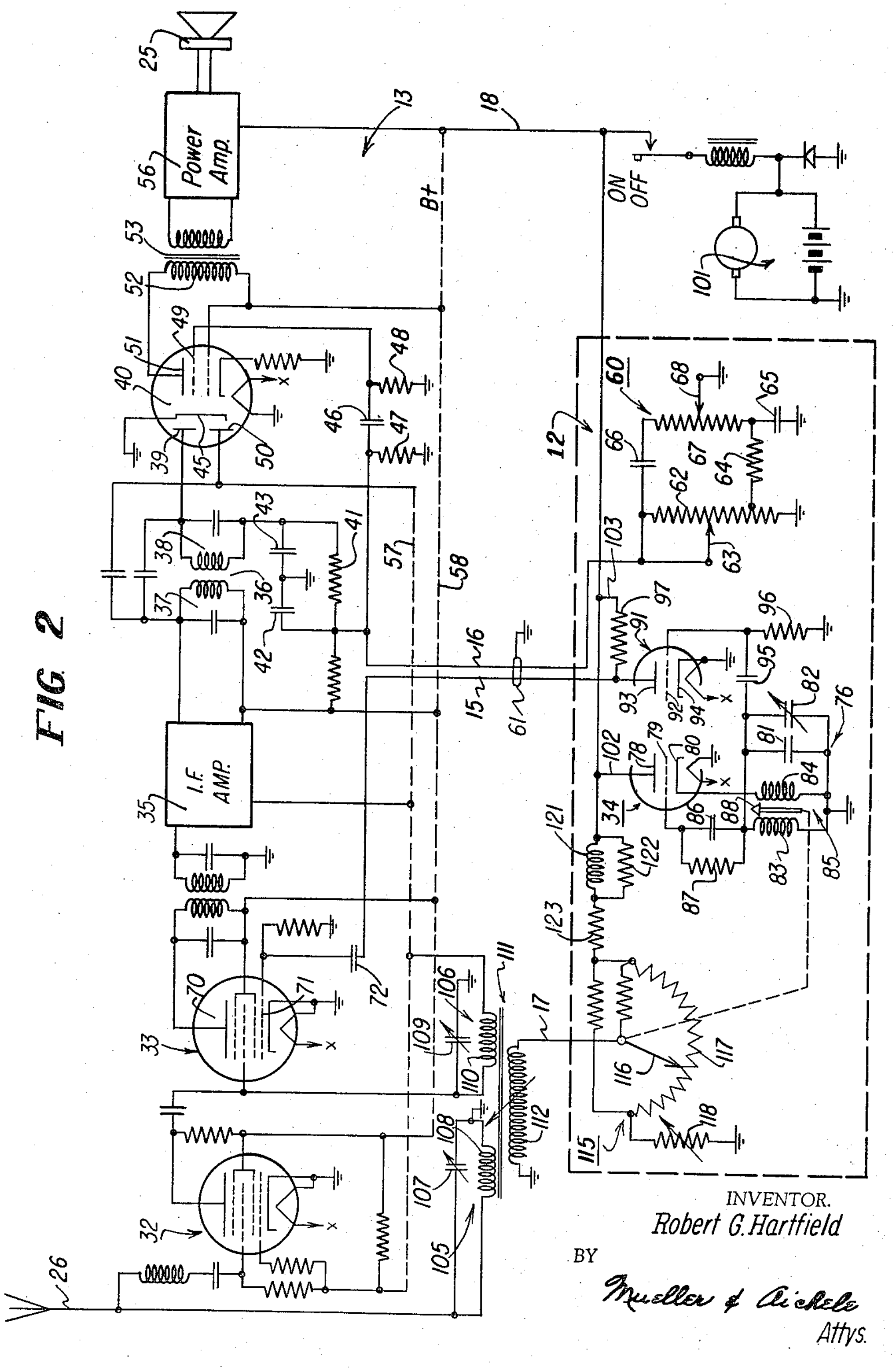
Fig. 2 is a schematic diagram showing the circuit of the radio receiver of Fig. 1.

Considering now the schematic diagram of the radio receiver 13 shown in Fig. 2, carrier wave signals picked up by the antenna 26 are applied to a radio frequency amplifier stage 32 which feeds amplified signals to a mixer stage 33 which provides heterodyning action according to a well-known principle. Locally generated signals used in the heterodyning action are supplied by the oscillator 34 located in the control unit 12. The resulting intermediate frequency signals are applied to an intermediate frequency amplifier 35 which may comprise one or more stages. The intermediate amplifier stage is tuned sharply to a fixed frequency, and therefore, it is important that the signal supplied thereto from the mixer stage 33 be controlled quite accurately at the proper frequency. The tuning of the oscillator 34 primarily controls the intermediate frequency beat, and accurate tuning thereof is greatly facilitated by mounting it in the control unit and by tuning it directly at that point as will be further explained. Amplifier signals are coupled through a transformer 36 having tuned circuits 37 and 38 to a diode detector formed by a plate 39 and a cathode 45 of the multiple element tube 40. The detected signals are filtered of any intermediate frequency carrier by the capacitors 42 and 43 and resistor 41, and an audio signal is developed across resistor 47.

The audio signal is transmitted through the capacitor 46 to the control grid 49 of the tube 40, and the plate 51 is supplied with B+ voltage from the power supply lead 18 through the primary winding 52 of a transformer 53. The tetrode section in the tube 40 is a first audio frequency amplifier stage, and the amplified audio output thereof is applied to a power amplifier stage 56 by the transformer 53. The power amplifier stage 56 drives the loudspeaker 25 which converts the audio frequency signals to sound energy. The other plate 50 included in the multi-element tube 40 develops an automatic volume control voltage which is applied to the various stages through a circuit 57 represented by a dotted line. The circuit for applying B+ potentials to the various stages in the receiver is represented by another dotted line 58. These dotted lines 57 and 58 serve to indicate that various additional circuit elements are provided to complete these circuits but are not shown as they are not required for an understanding of the invention.

The audio signal appearing across the resistor 47 is conducted through the lead 16 to the volume and tone control circuit 60 mounted in the control unit 12. The lead 16 is provided with a shield 61 to protect the audio signal from stray fields generated in the automobile to prevent noise from being picked up. The resistors 41 and 47 are connected by a variable resistor 62 to ground, and are also connected to a slider 63 which is moved to vary the resistance between the resistor 41 and ground. Accordingly, by adjustment of the slider 63 the signal appearing across the resistor 47 is variably attenuated to provide volume control for the receiver. Another resistor 64 in series with a capacitor 65 is connected from a tap on the resistor 62 to ground. This path offers low impedance to high audio frequency signal components and higher impedance to low audio frequency signal components to provide low frequency compensation. A tone control network consisting of a capacitor 66 and a resistor 67 is connected in series from the lead end of the resistor 62 to the common junction of the resistor 64 and the capacitor 65. A grounded slider 68 on the resistor 67 is moved to change the frequency response of the tone control network, and this affects the signal appearing across the resistor 47 to attenuate either the high or low frequency components thereof. Thus, the simple circuit 60 controls both the tone and the volume of the output of the receiver, and at the same time requires only a single conductor leading to the receiver.

The oscillator signal used in the mixer stage 33 is transmitted to the first grid 71 of the tube 70 by a capacitor 72 connected to the lead 15. The oscillator signal is produced by an oscillator circuit 34 which includes a triode having a plate 78, a grid 79, and a cathode 80. B+ potential is supplied to the plate 78 from the battery generator 101, and the resistor 87, by-passed by the capacitor 86, provides a D. C. return path to ground for the grid 79 and biases the grid 79 properly with respect to the cathode 80. A parallel tuned circuit, consisting of the capacitors 81 and 82 and the secondary winding 83 of the transformer 85, provides the required energy storage for the oscillator 34, and the feedback required to sustain oscillations is applied from the primary winding 84 to the secondary winding 83 of the transformer 85. The transformer 85 is provided with an iron core 88 which may be moved to change the inductance values of the windings 83 and 84. Thus, by varying the position of the iron core 88, the resonant frequency of the oscillator tuned circuit may be varied, and this provides a direct control for accurately tuning the frequency of the oscillator signal in order to ensure that the output signal of mixer stage 33 is at exactly the frequency required by the intermediate frequency amplifier stage 35 as previously explained.

The oscillator signal is conducted from the tuned circuit 76 through capacitor 95 to the grid 92 of a triode amplifier 91. B+ potential is supplied to the plate 93 by the resistor 97, which is connected to the lead from the battery generator 101. The resistor 96, connected between the grid 92 and ground, provides a D. C. return path for the grid and biases the same with respect to the cathode 94. The lead 15 is connected to the plate 93, so that the amplified voltage appearing on the plate 93 is supplied to the grid 71 of the mixer tube 70.

It should be noted that the oscillator 34 is isolated from the shielded lead 15 by the amplifier 91, and the load on the amplifier, which includes the shunt capacitance of the shielded lead 15, is not reflected back to the oscillator. The shunt capacitance of the shielded lead tends to vary due to changes in climatic conditions and changes in the lead dress in the car with aging. Since the oscillator is isolated from the lead, these changes do not affect it, and its load is therefore fixed.

When the frequency of the oscillator signal is varied by changing the position of the iron core 88, the frequency of the carrier wave signal must be changed simultaneously to provide tracking. The frequency of the carrier wave signal picked up by the antenna 26 is controlled by the tuned circuit 105, including the variable capacitor 107 and the inductor 108, and the frequency of the output of the radio frequency amplifier stage 32 is controlled by the tuned circuit 106, including the variable capacitor 109 and the inductor 110. These two tuned circuits are tuned to a rather broad band of frequencies since it is only necessary to reject spurious signals which would otherwise be passed by the intermediate frequency amplifier 35. The band width is such that these spurious signals will still be rejected when the tuning varies somewhat from the normal characteristic. Therefore, a saturable reactor 111 can be used satisfactorily to provide remote tuning of the tuned circuits 105 and 106 even though such tuning is subject to slight variations as a result of variations in the control voltage applied to the reactor and variations in the magnetic properties of the reactor cores.

Figures 3, 4:
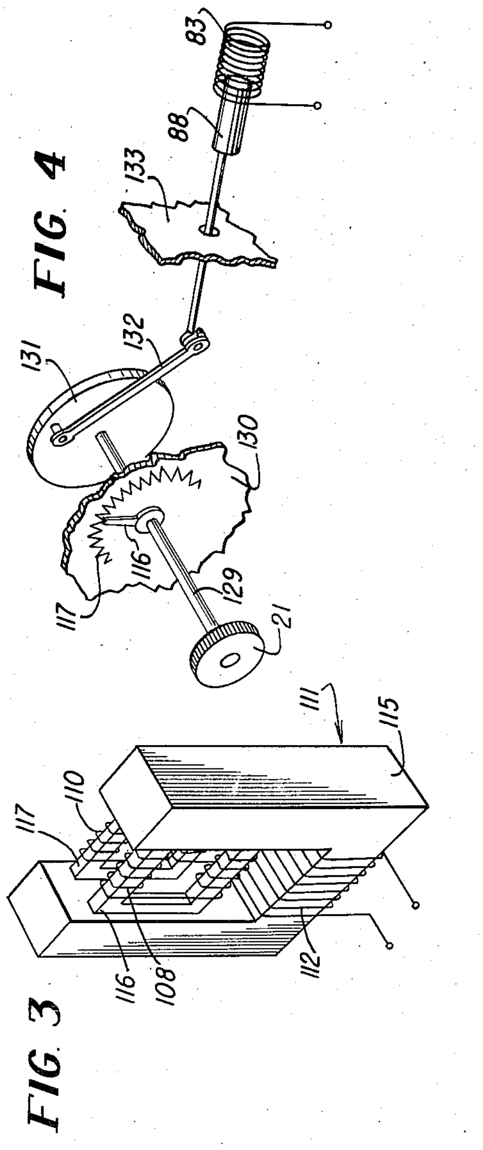
Fig. 3 is a perspective view showing a saturable reactor used in the radio receiver.
Fig. 4 is a perspective view showing a tracking mechanism used in the control unit.

A particular construction for the saturable reactor 111 is shown in Fig. 3. The reactor includes a U-shaped yoke 115 made of ordinary iron, and a magnetizing winding 112 is wound around a portion of this yoke. The open end of the yoke 115 is bridged by a pair of annular ferrite cores 116 and 117 to provide a closed path for the flux generated by the D. C. current in the magnetizing winding. The ferrite cores 116 and 117 have a rectangular annular shape, and the coil 108 is wound on the annular core 116 while the coil 110 is wound on the annular core 117. Each coil is wound so that a part thereof surrounds the upper leg of the associated annular core while another part surrounds the lower leg as viewed in Fig. 3, and these windings are arranged so that the flux generated by the radio frequency signal carried therein will be in opposite directions in the upper and lower legs. As the level of the direct current in the magnetizing winding 112 is changed, the degree of saturation in each of the annular cores 116 and 117 is changed, and the inductance values of the coils 108 and 110 are changed accordingly. It should be understood that the saturable reactor used in practicing the invention could be of a different construction than the one shown without affecting the scope of the invention in any way.

Referring again to Fig. 2, the level of the direct current supplied to the magnetizing winding 112 is controlled by the potentiometer 115 which is mounted in the control unit 12. The lead 17 is connected to the slider 116 of the variable resistor 117, and the resistor element thereof, which is a Nichrome wire, is connected to the battery generator 101 at one end and is returned to ground at the other end by a variable resistor 118. The slider or wiper 116 is moved to change the resistance between the battery generator 101 and the magnetizing winding 112, and thus the slider controls the level of the current in the magnetizing winding. The D. C. voltage supplied to the potentiometer is controlled by the coil 121 and the resistors 122 and 123. This network acts as a ballast circuit and provides a thermal delay for regulating the voltage supplied to the potentiometer.

Tracking between the oscillator and R. F. frequencies is accomplished by providing a mechanical device for moving the slider 116 and the iron core 88 in unison. A simple mechanical tracking device is shown in Fig. 4. The Nichrome wire 117 is mounted in a fixed position on a panel 130. An insulating disc 131 is mounted on one end of a shaft 129 and is turned by a control knob 21 mounted on the other end. One end of crank arm 132 is pivotally connected to the peripheral portion of the disc 131, and the other end of the arm is pivotallly connected to an extension of the core element 88. The core 88 is aligned with the opening in coil 83, and thus when the knob 21 is rotated, the core is moved either in or out of the coil depending on the direction of rotation. The core is supported in the proper position by a supporting plate represented by the member 133, or by any appropriate supporting means. The slider or wiper 116 is mounted on the shaft 129 and contacts the Nichrome wire 117. Thus, when the core 88 is moved by rotating the knob 21, the slider 116 is moved proportionately so that the antenna and R. F. stage track the oscillator.

It is apparent from the foregoing that the control unit of the invention provides remote tuning, tone and volume control in an improved manner. The use of a saturable reactor for tuning the antenna and the radio frequency amplifier has the advantage that the variable resistance control circuit required is extremely simple and requires very little space in the control unit. In addition, the lead connecting the control circuit to the receiver does not require shielding. Instead of using the saturable reactor for tuning an oscillator located in the receiver, the oscillator is located in the control unit and is tuned mechanically which avoids the problem of frequency drift caused by variations in the voltage supplied to the saturable reactor. The antenna circuit and the radio frequency amplifier stage may be more broadly tuned than the oscillator and slight variations in the tuning of these circuits can be tolerated without adverse effects. Of the leads connecting the control unit to the receiver, the only ones requiring shielding are those connected to the oscillator and to the volume-tone control circuit, and the oscillator is isolated from the lead connecting it to the receiver so that it is not affected by variations in the electrical properties of the lead.

I claim:

1. In a remote tuning control for a radio receiver, saturable reactor means located in the radio receiver for controlling the frequency of the carrier wave signal received thereby, said saturable reactor means including a magnetizing winding; a voltage source for applying a control voltage to said magnetizing winding; and a control unit located remotely from the radio receiver and adapted to be connected thereto by conductor means, said control unit including, variable resistance means for connecting said magnetizing winding to said voltage source, said variable resistance means including a movable control element for controlling the current in said magnetizing winding, oscillator means for supplying an oscillatory signal to the receiver for mixing with said carrier wave signal, a tuned circuit forming a part of said oscillator means and including an inductor having a movable ferro-magnetic core element for controlling the inductance value thereof, and manually operable mechanical drive means connected to said movable control element of said variable resistance means and to said movable core element of said oscillator tuned circuit for causing correlated movement thereof and thereby providing remote manual tuning of the receiver.

2. In a tuning control for a radio receiver, a plurality of tuned circuits conducting high frequency electric signals, each of said tuned circuits including an inductor having a ferro-magnetic core element, with at least one of said core elements being movable with respect to the associated inductor for controlling the inductance value thereof, a magnetizing winding magnetically coupled to said other core elements for controlling the permeability thereof and thereby controlling the inductance value of the associated inductors, a voltage source for applying a control voltage to said magnetizing winding, potentiometer means connecting said magnetizing winding to said voltage source, said potentiometer means having a movable control element for controlling the current level in said magnetizing winding, and mechanical drive means connected to said movable control element and to said movable core element for causing correlated movement thereof and thereby causing said tuned circuits to track.

3. A radio receiver including a main portion adapted to be located at a first position and a control portion adapted to be located at a second position remote from said first position, a plurality of tuned circuits conducting high frequency electric signals, with at least one of said tuned circuits being located in said control portion and the others of said tuned circuits being located in said main portion, each of said tuned circuits including an inductor having a ferro-magnetic core element with the core element associated with the tuned circuit located in said control portion being movable with respect to the associated inductor for controlling the inductance value thereof, a magnetizing winding magnetically coupled to said core elements of said tuned circuits in said main portion for controlling the permeability thereof and thereby controlling the inductance values of the associated inductors, a voltage source for applying a control voltage to said magnetizing winding, potentiometer means located in said control portion and connecting said magnetizing winding to said voltage source, said potentiometer means having a movable control element for controlling the current in said magnetizing winding, and mechanical drive means located in said control portion and connected to said movable control element and to said movable core element for causing correlated movement thereof and thus causing said tuned circuits to track.

4. In a remote tuning control for a superheterodyne radio reeciver having an antenna, a radio frequency amplifier stage, and a mixer stage, the combination including a first tuned circuit coupled to the antenna and including an inductor having a first core element made of highly permeable ferro-magnetic material, a second tuned circuit coupled to the radio frequency amplifier stages and including a second core element made of highly permeable ferro-magnetic material, said first and second tuned circuits being tuned relatively broadly, a magnetizing winding magnetically coupled to said first and second core elements for controlling the permeability thereof and thereby controlling the inductance values of the associated inductors, a voltage source for applying a control voltage to said magnetizing winding, and a control unit located remotely from all of the aforementioned elements, said control unit including potentiometer means connecting said magnetizing winding to said voltage source, said potentiometer means having a movable control element for controlling the level of current in said magnetizing winding, oscillator means connected to the mixer stage and including a third tuned circuit having an inductor with a third core element made of ferro-magnetic material, said third tuned circuit being tuned relatively sharply, said third core element being movable with respect to the associated inductor for controlling the inductance value thereof, and manually operable mechanical drive means connected to said control element of said potentiometer means and to said third core element for causing correlated movement thereof and thereby causing said first, second and third tuned circuits to track.

5. In a remote control system for use with a superheterodyne radio receiver adapted to be mounted in an automobile which includes a trunk, and a dashboard, and which automobile has a battery-generator voltage source, the combination including a main receiver portion mounted in the automobile trunk and including first and second tuned circuits for controlling the frequency of the carrier wave signal received thereby, said first and second tuned circuits each including an inductor having a core element made of highly permeable ferro-magnetic material, a magnetizing winding magnetically coupled to the core elements of said first and second tuned circuits for controlling the permeability thereof and thereby controlling the inductance values of the associated inductors, and a control unit for mounting on the dashboard of the automobile including potentiometer means connecting said magnetizing winding to the battery-generator voltage source for controlling the current in said magnetizing winding, oscillator means for supplying an oscillatory signal to the receiver for mixing with the carrier wave signal received thereby, amplifier means coupled to said oscillator means for increasing the level of said oscillatory signal applied to the receiver, a third tuned circuit forming a part of said oscillator means and including an inductor having a core element made of ferro-magnetic material, said core element of said third tuned circuit being movable with respect to the associated inductor for controlling the inductance value thereof, and mechanical drive means connected to said potentiometer means and to said movable core element of said third tuned circuit for causing correlated movement thereof and thereby causing said first, second and third tuned circuits to track.

6. In a remote control system for use in a superheterodyne radio receiver adapted to be mounted in the trunk of an automobile which includes a battery-generator voltage source and a dashboard, the combination including saturable reactor means in the radio receiver for controlling the frequency of the carrier wave signal received thereby, said saturable reactor means including a magnetizing winding, and a control unit for mounting on the dashboard of the automobile, said control unit including potentiometer means connecting said magnetizing winding to the battery-generator voltage source, said potentiometer means having a movable control element for controlling the level of current in said magnetizing winding, oscillator means for applying an oscillatory signal to the radio receiver for mixing with the carrier wave signal received thereby, amplifier means coupled to said oscillator means for increasing the level of said oscillator signal, shielded conductor means connecting said amplifier means to the radio receiver, said oscillator means being isolated from said shielded conductor by said amplifier means to provide a fixed load for said oscillator means, and mechanical drive means connected to said movable control element of said potentiometer means and to said movable core element of said tuned circuit means for causing correlated movement thereof and thereby maintaining a desired frequency relationship between the carrier wave signal and the oscillator signal mixed therewith.

7. In a remote control system for use with a superheterodyne radio receiver adapted to be mounted in the trunk of an automobile which includes a battery-generator voltage source and a dashboard, the combination including saturable reactor means in the radio receiver for controlling the frequency of the carrier wave signal received thereby, said saturable reactor means including a magnetizing winding, a mixer stage in the receiver for mixing the carrier wave signals with an oscillatory electric signal applied thereto to provide heterodyning action, an audio signal voltage point in the receiver connected to an audio frequency amplifier stage, and a control unit for mounting on the dashboard of the automobile, said control unit including potentiometer means connecting said magnetizing winding of said saturable reactor means to the battery-generator voltage source of the automobile for controlling the current in said magnetizing winding, oscillator means for supplying an oscillatory signal to said mixer stage, amplifier means for increasing the level of said oscillatory signal, a volume-tone control network including a volume control variable resistor and a variable resistance-capacitance circuit connected in parallel with the volume control variable resistor, a first shielded lead connecting said amplifier means of said control unit to said mixer stage, a second shielded lead connecting said volume-tone control network to said audio signal voltage point, tuned circuit means forming a part of said oscillator means and including an inductor having a permeable core element, said core element being movable with respect to the associated inductor for controlling the inductance value thereof and the resonant frequency of said tuned circuit means, and mechanical drive means connected to said potentiometer means and to said movable core element for causing correlated movement thereof for providing tracking.

References Cited in the file of this patent

UNITED STATES PATENTS

| | | |
|---|---|---|
| 1,922,623 | Hotoff | Aug. 15, 1933 |
| 2,152,336 | Van Loon | Mar. 20, 1939 |
| 2,810,826 | Hargens | Oct. 22, 1957 |